(12) United States Patent
Lee

(10) Patent No.: US 9,257,310 B2
(45) Date of Patent: Feb. 9, 2016

(54) METHOD OF MANUFACTURING CIRCUIT BOARD AND CHIP PACKAGE AND CIRCUIT BOARD MANUFACTURED BY USING THE METHOD

(71) Applicant: HAESUNG DS CO., LTD., Changwon-Si (KR)

(72) Inventor: Sang-Min Lee, Changwon (KR)

(73) Assignee: HAESUNG DS CO., LTD., Changwon-si (KR)

( * ) Notice: Subject to any disclaimer, the term of this patent is extended or adjusted under 35 U.S.C. 154(b) by 37 days.

(21) Appl. No.: 13/924,705

(22) Filed: Jun. 24, 2013

(65) Prior Publication Data
US 2014/0113415 A1      Apr. 24, 2014

(30) Foreign Application Priority Data

Oct. 19, 2012   (KR) .................. 10-2012-0116744
Feb. 26, 2013   (KR) .................. 10-2013-0020670

(51) Int. Cl.
| | |
|---|---|
| H01L 21/52 | (2006.01) |
| H05K 3/46 | (2006.01) |
| H01L 23/14 | (2006.01) |
| H01L 23/498 | (2006.01) |

(Continued)

(52) U.S. Cl.
CPC .............. *H01L 21/52* (2013.01); *H01L 23/145* (2013.01); *H01L 23/49822* (2013.01); *H01L 23/49827* (2013.01); *H01L 25/0657* (2013.01); *H05K 3/002* (2013.01); *H05K 3/4697* (2013.01); *H01L 23/053* (2013.01); *H01L 23/5383* (2013.01); *H01L 23/5384* (2013.01); *H01L 24/48* (2013.01); *H01L 2224/48091* (2013.01); *H01L 2224/48227* (2013.01); *H01L 2225/0651* (2013.01); *H01L 2924/00014* (2013.01); *H05K 1/0366* (2013.01); *H05K 1/0373* (2013.01); *H05K 3/429* (2013.01); *H05K 3/4602* (2013.01); *H05K 2201/09118* (2013.01); *H05K 2201/09536* (2013.01); *H05K 2201/09845* (2013.01); *H05K 2203/0554* (2013.01)

(58) Field of Classification Search
CPC ......... H01L 21/48; H01L 21/44; H01L 21/52; H01L 23/145; H01L 23/5383; H01L 24/82; H05K 3/4697; H05K 1/181; H05K 3/46
USPC ..................................................... 438/124–126
See application file for complete search history.

(56) References Cited

U.S. PATENT DOCUMENTS

| | | | |
|---|---|---|---|
| 6,900,117 B2 | 5/2005 | Yoda | |
| 2005/0230835 A1* | 10/2005 | Sunohara et al. | 257/758 |
| 2006/0003495 A1* | 1/2006 | Sunohara et al. | 438/124 |

FOREIGN PATENT DOCUMENTS

| | | |
|---|---|---|
| JP | 2002203869 A | 7/2002 |
| KR | 1020090053443 A | 5/2009 |

(Continued)

*Primary Examiner* — Selim Ahmed
(74) *Attorney, Agent, or Firm* — Sughrue Mion, PLLC

(57) ABSTRACT

Provided is a method of manufacturing a circuit board. The method includes: preparing a base substrate including a core layer and a first conductive layer that is formed on at least one surface of the core layer and includes an internal circuit pattern; forming a build-up material to cover the first conductive layer; forming in the build-up material at least one cavity through which the core layer and the first conductive layer are exposed; forming a laminated body by curing the build-up material in which the at least one cavity is formed; and forming a second conductive layer including an external circuit pattern on an outer surface of the laminated body.

17 Claims, 4 Drawing Sheets

(51) Int. Cl.
*H01L 25/065* (2006.01)
*H05K 3/00* (2006.01)
*H01L 23/053* (2006.01)
*H01L 23/00* (2006.01)
*H01L 23/538* (2006.01)
*H05K 1/03* (2006.01)
*H05K 3/42* (2006.01)

(56) References Cited

FOREIGN PATENT DOCUMENTS

| | | |
|---|---|---|
| KR | 1020110093406 A | 8/2011 |
| KR | 101136396 B1 | 4/2012 |
| WO | 2011099820 A3 | 8/2011 |

\* cited by examiner

METHOD OF MANUFACTURING CIRCUIT BOARD AND CHIP PACKAGE AND CIRCUIT BOARD MANUFACTURED BY USING THE METHOD

CROSS-REFERENCE TO RELATED PATENT APPLICATION

This application claims priority from Korean Patent Application No. 10-2012-0116744, filed on Oct. 19, 2012, and Korean Patent Application No. 10-2013-0020670, filed on Feb. 26, 2013, in the Korean Intellectual Property Office, the disclosures of which are incorporated herein in their entirety by reference.

BACKGROUND

1. Field

Methods and apparatuses consistent with exemplary embodiments relate to manufacturing a circuit board including a cavity and a chip package, and a circuit board manufactured by using the method.

2. Description of the Related Art

As sizes of components of electronic devices have recently reduced and consumers prefer one product with various functions, the number of components of an electronic device has increased. Accordingly, there is a demand for technology for mounting many electronic components on a circuit board at a high density.

A multi-layer circuit board is an element of an electronic device which is formed by stacking a plurality of substrates as multi-layers in each of which electronic components are mounted. Since a multi-layer circuit board may perform more electrically complex functions than a single-sided board or a double-sided board, and may enable electronic components to be mounted thereon at a high density, the multi-layer circuit board is widely applied to a variety of electronic devices.

In particular, there is a recent demand for a system integration technology for making an electronic product light, thin, short, and small, and a technology of manufacturing a cavity printed circuit board (PCB) has attracted attention as a system integration technology. In a cavity PCB, since components are, instead of being completely embedded on a PCB, embedded in a cavity that is formed in a direction in which a chip is mounted, it is much more efficient in the cavity PCB to replace the components or check the components than in an embedded PCB.

However, a multi-layer technology is rarely applied to a cavity PCB. This is because it is difficult to accurately form a cavity and an internal circuit in the cavity may be damaged during plating or etching performed in a PCB process.

In particular, in a method of selectively forming a cavity by using laser drilling in a PCB on which finished components are stacked, since it is difficult to adjust a depth, an internal circuit pattern and an internal insulating layer may be frequently damaged. Also, when a cavity is formed by using a router, since there is a big difference in processing precision and the cavity has to be formed individually, product reliability during mass production may be reduced and it is difficult to mass produce devices due to low productivity. Also, a method of selectivity forming a cavity by precisely punching a position of the cavity in a finished product by using a punching device inevitably results in damage to an outer wall of the cavity. Due to the damage to the outer wall of the cavity, de-lamination due to moisture absorption and damage to a bottom surface of the cavity are caused. Due to costs of manufacturing the punching jig, overall manufacturing costs are increased and a design width of the cavity is very small. When a cavity is formed and components are stacked before an insulating layer is stacked, since it is difficult to control the flow of a thermosetting resin, smears tend to be produced and an additional desmear process has to be performed. Also, since it is difficult to completely remove smears, the reliability of a substrate is reduced and mass productivity is reduced.

SUMMARY

One or more exemplary embodiments provide a method of simply manufacturing a circuit board and a chip package at low costs, and a circuit board manufactured by using the method.

According to an aspect of an exemplary embodiment, there is provided a method of manufacturing a circuit board, the method including: preparing a base substrate including a core layer and a first conductive layer that is formed on at least one surface of the core layer and includes an internal circuit pattern; forming a build-up material to cover the first conductive layer; forming in the build-up material at least one cavity through which the core layer and the first conductive layer are exposed; forming a laminated body by curing the build-up material in which the at least one cavity is formed; and forming a second conductive layer including an external circuit pattern on an outer surface of the laminated body.

The build-up material may include a matrix in which a structural body is impregnated, and the matrix comprises a thermosetting resin in a B-stage.

The forming the laminated body may include applying heat to perform cross-linking on the thermosetting resin in the B-stage and to obtain a thermosetting resin in a C-stage.

The weight of the thermosetting resin in the B-stage may be less than the weight of the thermosetting resin in the C-stage.

A process temperature for forming the build-up material may be lower than a process temperature for curing the build-up material.

The forming the at least one cavity may include using wet etching to remove the build-up material exposed in a portion in which the at least one cavity is to be formed by using a solution.

The solution may include a glass etching agent.

The core layer may be formed of the same material as a material of the laminated body.

The build-up material may include a metal layer formed on an outer surface of the build-up material facing the base substrate.

Before the forming of the at least one cavity, the method may further include removing a portion of the metal layer in which the at least one cavity is to be formed.

According to an aspect of another exemplary embodiment, there is provided a circuit board manufactured by using the above method.

According to an aspect of another exemplary embodiment, there is provided a method of manufacturing a chip package, the method including: preparing a base substrate including a core layer and a first conductive layer that is formed on at least one surface of the core layer and includes an internal circuit pattern; forming a build-up material to cover the first conductive layer; forming in the build-up material at least one cavity through which the core layer and the first conductive layer are exposed; forming a laminated body by curing the build-up material in which the at least one cavity is formed; forming a second conductive layer including an external circuit pattern on an outer surface of the laminated body; and mounting a semiconductor chip in the at least one cavity and electrically connecting the semiconductor chip and at least one of the first and second conductive layers.

The build-up material may include a matrix in which a structural body is impregnated, and the matrix comprises a thermosetting resin in a B-stage.

The forming the laminated body may include applying heat to perform cross-linking on the thermosetting resin in the B-stage and to obtain a thermosetting resin in a C-stage.

The weight of the thermosetting resin in the B-stage may be less than the weight of the thermosetting resin in the C-stage.

The forming the at least one cavity may include using wet etching to remove the build-up material exposed in a portion in which the at least one cavity is to be formed by using a solution.

BRIEF DESCRIPTION OF THE DRAWINGS

The above and other features will become more apparent by describing in detail exemplary embodiments with reference to the attached drawings, in which.

DETAILED DESCRIPTION OF THE EXEMPLARY EMBODIMENTS

Figure 1:
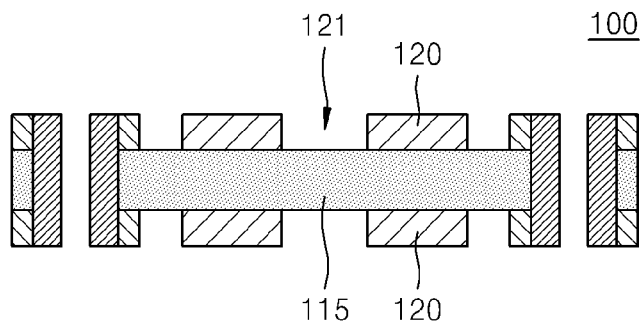
FIGS. 1, 2, 5, 6, 7, and 9 are cross-sectional views for explaining a method of manufacturing a circuit board, according to exemplary embodiments.

As the inventive concept allows for various changes and numerous embodiments, particular exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the present invention. In the description of the embodiments herein, certain detailed explanations of related art are omitted when it is deemed that they may unnecessarily obscure the essence of the inventive concept.

The terminology used herein is for the purpose of describing particular embodiments only and is not intended to be limiting the inventive concept. As used herein, the singular forms "a", "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

As used herein, the term "and/or" includes any and all combinations of one or more of the associated listed items. Expressions such as "at least one of," when preceding a list of elements, modify the entire list of elements and do not modify the individual elements of the list.

The embodiments will now be described more fully with reference to the accompanying drawings. Thicknesses of various layers and regions are enlarged for clarity in the drawings. Thicknesses of some layers and regions are exaggerated for convenience of explanation in the drawings.

Figure 3:
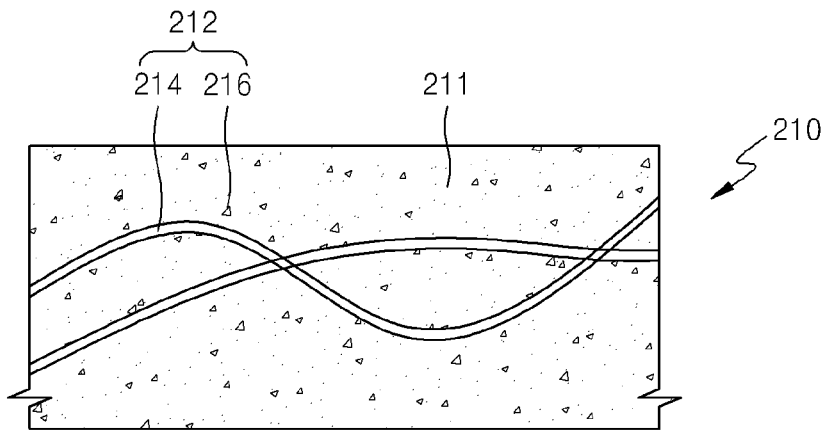
FIG. 3 is a detailed view illustrating a build-up material of FIG. 2, according to an exemplary embodiment.
Figure 4:
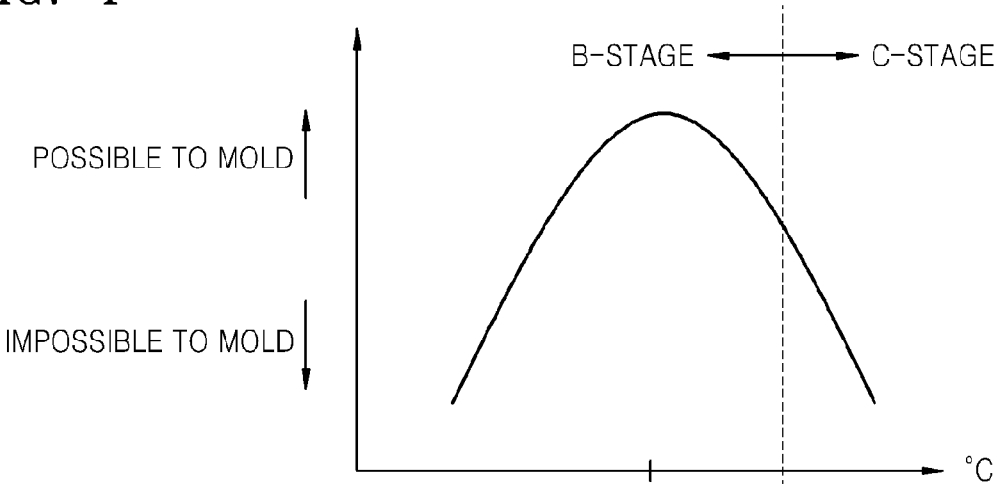
FIG. 4 is a graph illustrating whether a thermosetting resin may be molded according to a temperature, according to an exemplary embodiment.

FIGS. 1, 2, 5, 6, 7, and 9 are cross-sectional views for explaining a method of manufacturing a circuit board, according to an exemplary embodiment. FIG. 3 is a detailed view illustrating a build-up material 210 of FIG. 2. FIG. 4 is a graph illustrating whether a thermosetting resin may be molded according to a temperature, according to an exemplary embodiment. FIG. 8 is a graph illustrating a process temperature per cycle of a method of manufacturing a circuit board, according to an exemplary embodiment Referring to FIG. 1, a base substrate 100 is prepared.

The base substrate 100 is a portion where an internal circuit pattern 121 for transmitting an electrical signal is formed in a circuit board. The base substrate 100 includes a conductive layer 120 including the internal circuit pattern 121 formed on each of both surfaces of a core layer 115.

The core layer 115 is formed of the same material as a laminated body 215 (see FIG. 7) that will be explained below. In detail, the core layer 115 includes a thermosetting resin that is fully cured, like the laminated body 215.

The conductive layer 120 may include an electrically conductive material such as copper (Cu) or silver (Ag), but the present embodiment is not limited thereto. The conductive layer 120 may be formed on each of both surfaces of the core layer 115 by using screen printing or roll coating.

The internal circuit pattern 121 may be formed by using any of various patterning methods such as a subtractive method including a tenting method and a panel/pattern method, and an additive method including a semi-additive (SAP) method, a modified semi-additive (MSAP) method, an advanced modified semi-additive (AMSAP) method, and a full-additive (FAP) method. In short, a subtractive method involving selectively removing an unnecessary portion other than a conductor from the conductive layer 120 to form a circuit board, and an additive method involving selectively depositing a conductive material by using plating on the core layer 115 to form a circuit pattern are well known, and thus a detailed explanation thereof will not be given. A result obtained by forming the internal circuit pattern 121 by using a tenting method is shown in FIG. 1.

A through-hole or a via-hole may be formed in the base substrate 100 to supply electricity through the internal circuit patterns 121 formed over and under the core layer 115. Although two through-holes whose inner surfaces are plated are illustrated in FIG. 1, the number and shapes of through-holes are not limited thereto. A thickness, a material, a shape, and a structure of the base substrate 100 are not limited to those described above, and may vary according to need.

Figure 2:
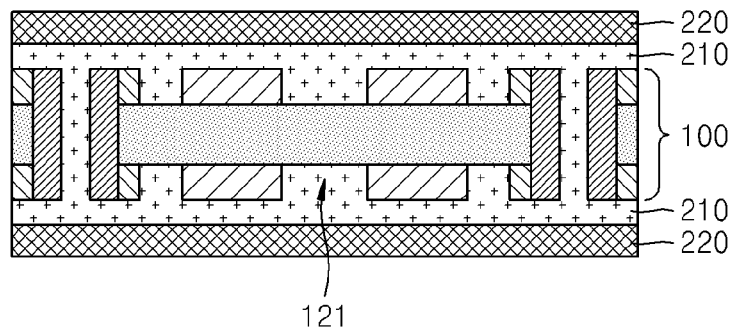

Referring to FIG. 2, a build-up material 210 is formed on the base substrate 100.

The build-up material 210 insulates the conductive layer 120 from metal layers 220 (see FIG. 9) when a multi-layer circuit board is manufactured. The build-up material 210 includes a structural body 212 (see FIG. 3) and a matrix 211 (see FIG. 3) in which the structural body 212 is impregnated.

FIG. 3 is a detailed view illustrating the build-up material 210 of FIG. 2.

Figure 7:
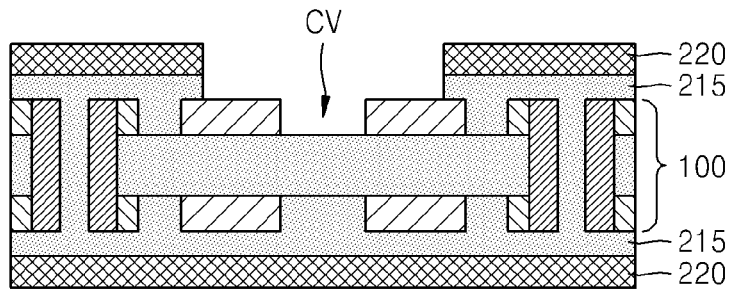
Figure 8:
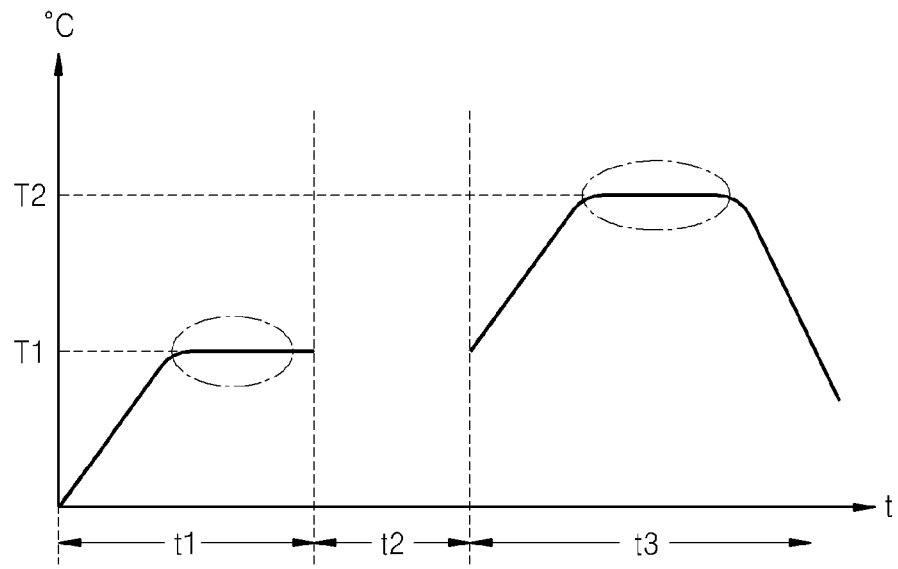
FIG. 8 is a graph illustrating a process temperature per cycle of a method of manufacturing a circuit board, according to an exemplary embodiment.

The structural body 212 is a material that is added to increase mechanical and chemical strength and durability of the build-up material 210 or the laminated body 215 (see FIG. 7). For example, the structural body 212 includes a glass-based material. In detail, the structural body 212 may include a glass fiber fabric 214 and a silica-based filler 216. The glass fiber fabric 214, which is a linear material, is woven in the build-up material 210 or the laminated body 215 to support an overall structure of the build-up material 210 or the laminated body 215 (see FIG. 7), and functions as, for example, a reinforcing rod in reinforced concrete. The silica-based filler 216, which is a particle material, is dispersed in the laminated body 215 (see FIG. 7) or the build-up material 210 to increase strength and durability, and functions as, for example, pebbles in reinforced concrete.

The matrix 211 refers to a material in which the structural body 212 is impregnated and which insulates the different conductive layers 120 from one another, and insulates the conductive layer 120 from the metal layers 220. The matrix 211 includes a thermosetting resin such as an epoxy resin. According to an exemplary embodiment, the matrix 211 included in the build-up material 210 is a thermosetting resin. Characteristics of a thermosetting resin in a B-stage will be explained in detail.

FIG. 4 is a graph illustrating a relationship between a stage and a temperature of a thermosetting resin.

Referring to FIG. 4, the X-axis represents a temperature and the Y-axis represents molding characteristics of a thermosetting resin according to a temperature. That is, a temperature increases from a low temperature to a high temperature along the X-axis, and mobility of a thermosetting resin increases along the Y-axis.

A thermosetting resin includes at least a B-stage and a C-stage.

A B-stage refers to a state where a thermosetting resin is partially cured and an intermediate stage of curing reaction, before being fully cured. A thermosetting resin in a B-stage includes polymers that do not undergo cross-linking due to heat. Accordingly, when heat is applied to the thermosetting resin in the B-stage, kinetic energy of the polymers increases to have mobility or softness. When contacting a certain solution, molecules in the solution penetrate between the polymers to swell the thermosetting resin.

The matrix 211 included in the build-up material 210 is a thermosetting resin in a B-stage as described above. Accordingly, when heat is applied to the build-up material 210, mobility may be obtained, and thus, molding may be performed. Referring to FIG. 4, it is found that when heat is applied to a thermosetting resin in a B-stage, the thermosetting resin is not cured but is softened enough to mold. Accordingly, when heat is applied to the build-up material 210 stacked on the base substrate 100, a thermosetting resin in a B-stage included in the build-up material 210 may be molded. Accordingly, when lamination is performed by applying pressure, the thermosetting resin is filled in the internal circuit pattern 121. A temperature of heat applied to mold the thermosetting resin is a temperature before the thermosetting resin enters a C-stage. A temperature of heat applied to mold, for example, an epoxy resin, may be about 120° C. to about 180° C. As will be described in detail with reference to FIG. 6, since the matrix 211 included in the build-up material 210 is a thermosetting resin in a B-stage, the matrix 211 has low chemical resistance. Accordingly, since the matrix 211 may be etched by a solution, a cavity CV may be formed by using wet etching.

Next, a C-stage refers to a state where a thermosetting resin is fully cured. That is, a C-stage refers to a state where energy is applied to perform cross-linking, and thus, thermosetting resins are stably cross-linked. Accordingly, since sizes of polymers are increased due to the cross-linking, a weight of a thermosetting resin in a C-stage is greater than a weight of a thermosetting resin in a B-stage. Since it is impossible to mold the thermosetting resin in the C-stage by applying heat, the thermosetting resin in the C-stage is insoluble and infusible in a certain solution. As will be described in detail with reference to FIG. 7, the matrix 211 included in the laminated body 215 (see FIG. 7) is a thermosetting resin in a C-stage obtained by fully curing the thermosetting resin of the B-stage included in the build-up material 210. Accordingly, the laminated body 215 may not be molded, and chemical resistance, strength, and durability are increased.

As shown in FIG. 2, the build-up material 210 may include metal layers 220 formed on outer surfaces of the build-up material 210 facing the base substrate 100. The metal layers 220 may be formed of Cu or Ag.

However, the present embodiment is not limited to FIG. 2, and the build-up material 210 without the metal layer 220 may be coated on the base substrate 100 and then the metal layers 220 may be separately formed on the outer surfaces of the build-up material 210 by using screen printing or roll coating.

Figure 5:
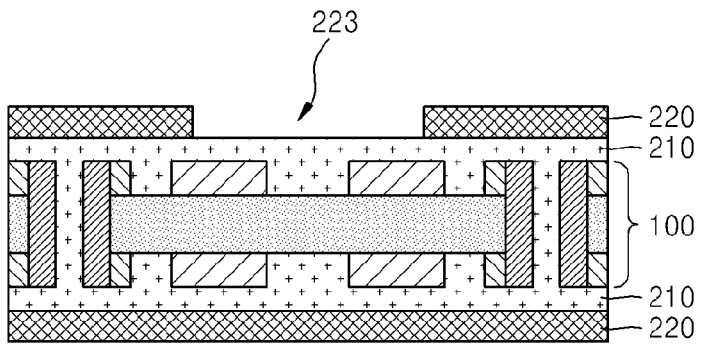

Referring to FIG. 5, a portion of the metal layer 220 in which the cavity CV is to be formed is removed.

In detail, a process of FIG. 5 is referred to as a window-forming process. According to an exemplary embodiment, the cavity CV in the build-up material 210 is formed by using wet etching. Accordingly, when the metal layer 220 is formed on the build-up material 210, a window-forming process is performed.

Although not shown, a dry film resist (DRF) is coated, exposure and development are performed, and a pattern is formed on a portion 223 in which the cavity CV is to be formed. Next, a portion of the metal layer 220 corresponding to the portion 223 in which the cavity CV is to be formed is removed by using the DFR on which the pattern is formed as a mask. Next, the DFR is stripped off. The window-forming process may be performed in any of other well-known manners.

Figure 6:
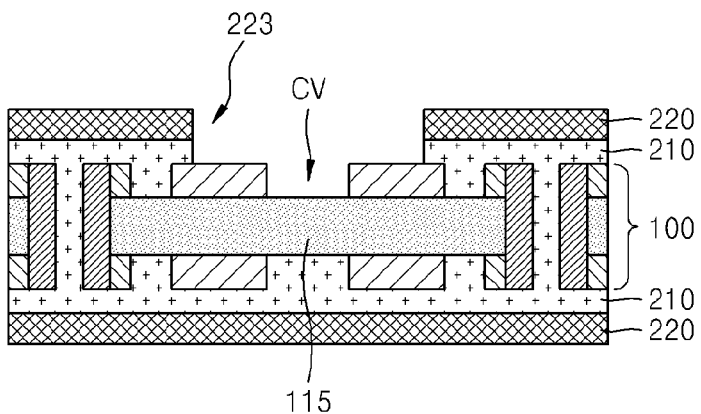

Referring to FIG. 6, at least one cavity CV is collectively formed in the build-up material 210. Although only one cavity CV is shown in FIG. 6, a plurality of the cavities CV may be formed according to a product design.

The cavity CV in which a semiconductor chip is mounted is formed by removing the build-up material 210. The cavity CV, which is an opening through which the core layer 115 disposed under the build-up material 210 and the conductive layer 120 including the internal circuit pattern 121 are exposed, is different from a via-hole through which only the conductive layer 120 disposed under the build-up material 210 is exposed. Since the cavity CV is an empty space in which a semiconductor chip is to be mounted later, a function of the cavity CV is different from that of the via-hole whose inner surface is plated and which acts as an electrically connected member. Also, the cavity CV is different from the via-hole in that the cavity CV has a width great enough to mount a semiconductor chip therein.

In detail, the cavity CV is formed by using wet etching. The cavity CV is formed by removing the build-up material 210 exposed in the portion 223 in which the cavity CV is to be formed by using the metal layer 220 as a self-aligned mask. The build-up material 210 includes the matrix 211 and the structural body 212 as described above with reference to FIG. 3. Accordingly, a solution used for wet etching has to be able to remove the structural body 212 as well as the matrix 211. The solution includes a glass etching agent that may remove the structural body 212 having a glass component.

A method of removing the build-up material 210 may be performed by only one process or by a plurality of repeated processes. For example, the matrix 211 included in the build-up material 210 of the portion 223 in which the cavity CV is to be formed may be removed by using a first solution in a first process, and the structural body 212 included in the build-up material 210 of the portion 223 in which the cavity CV is to be formed may be removed by using a second solution in a second process. If necessary, the first process after the second process may be repeatedly performed, and the second process may be first performed and then the first process may be performed.

The first solution may be an alkaline solution such as sodium permanganate or sodium hydroxide, an organic solvent such as acetone, or other acid solutions. The second solution may be an acid solution such as hydrofluoric acid (HF) or a well-known glass etching agent. Before the matrix 211 is removed in the first process, an acidic, alkaline, or neutral etching assistant that swells a thermosetting resin may be used.

According to an exemplary embodiment, the cavity CV is formed by using wet etching in a state where the build-up material 210 is formed.

Since the build-up material 210 includes a thermosetting resin in a B-stage as described above, the cavity CV may be formed by using wet etching. When the build-up material 210 is formed on both surfaces of the base substrate 100 and directly cured, since the thermosetting resin of the B-stage is fully cured and is changed to a thermosetting resin in a C-stage having high chemical resistance, it is impossible to form the cavity CV by using wet etching. However, according to the present embodiment, since the build-up material 210 is formed, and the cavity CV is formed before the build-up material 210 is cured into the laminated body 215 (see FIG. 7), wet etching may be performed.

As described with reference to FIG. 1, the core layer 115 includes a thermosetting resin in a C-stage like the laminated body 215 (see FIG. 7). Accordingly, even when the core layer 115 is exposed to an etching solution during a process of forming the cavity CV, the core layer 115 is not damaged by the etching solution. That is, since the core layer 115 and the build-up material 210 include thermosetting resins in different stages, there is a predetermined etching selectivity. Also, since materials of the build-up material 210 and the conductive layer 120 are different from each other, the conductive layer 120 does not react with an etching solution for removing the build-up material 210.

According to the present embodiment, since the cavity CV is formed by using wet etching, problems of a method of forming a cavity in a PCB on which finished components are stacked may be solved and cavities may be collectively formed. Also, since damage to an outer wall in a method of precisely punching a position of a cavity in a finished product is avoided and a punching jig is not required, cavities having various shapes may be designed at low costs. In addition, smears may be prevented from being produced and manufacturing costs and a process time may be reduced.

Referring to FIG. 7, the laminated body 215 is formed by fully curing the build-up material 210 in which the cavity CV is formed.

In detail, the laminated body 215 includes the matrix 211 (see FIG. 3) and the structural body 212 (see FIG. 3) like the build-up material 210, but the matrix 211 included in the laminated body 215 is a thermosetting resin in a C-stage. A step of forming the laminated body 215 is a step of applying heat to the thermosetting resin in the B-stage included in the build-up material 210 to obtain a thermosetting resin in a C-stage. That is, heat energy is applied to perform cross-linking, and thus, thermosetting resins are stably cross-linked. Accordingly, chemical resistance, strength, and durability of the laminated body 215 are improved.

A temperature for fully curing the build-up material 210 may be higher than a temperature for molding the build-up material 210 of FIG. 2. For example, curing may be performed for several minutes at a temperature equal to or higher than about 200° C.

FIG. 8 is a graph illustrating a process temperature per cycle of a method of manufacturing a circuit board, according to an exemplary embodiment.

The method of FIG. 8 involves forming the laminated body 215 from the build-up material 210 intermittently. That is, a step of forming and molding the build-up material 210 at a temperature of T1 is performed in a duration of t1. A step forming the laminated body 215 by curing the build-up material 210 is intermittently performed in a duration of t3. A step of forming the cavity CV is performed in a duration of t2 between the duration t3 and the duration t1. After the cavity CV is etched, the laminated body 215 is formed by curing the build-up material 210 at a temperature of T2 in the duration of t3.

A process temperature in the duration of t1 for forming the build-up material 210 and molding the build-up material 210 to penetrate between the internal circuit patterns 121 is lower than a process temperature in the duration of t3 for forming the laminated body 215. This is because heat energy for causing polymers to be cross-linked is higher than heat energy for increasing mobility of the polymers.

According to the present embodiment, the laminated body 215 of a final circuit board including polymers having desired strength and durability may have physical properties suitable for a package, and the cavities CV may be collectively formed by using an intermittent process and a wet etching process. Accordingly, the method of manufacturing a circuit board, according to the present embodiment, may manufacture a circuit board having physical properties satisfying a user's demands at a reduced lead time, reduced investment costs, and reduced equipment costs.

Figure 9:
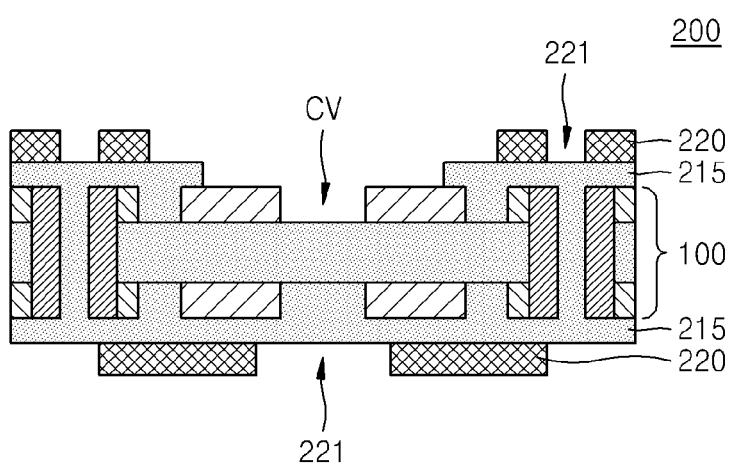

Referring to FIG. 9, an external circuit pattern 221 is formed on the metal layer 220 provided on an outer surface of the laminated body 215. A method of forming the external circuit pattern 221 may be performed in the same manner as that of forming the internal circuit pattern 121. Although not shown in FIG. 9, a circuit board may be manufactured by printing a protective layer by forming a via-hole and performing other surface treatments.

Figure 10:
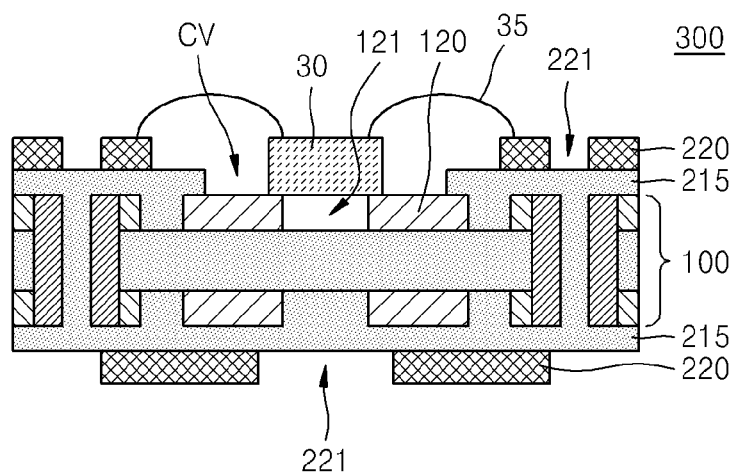
FIGS. 10 and 11 are cross-sectional views illustrating chip packages manufactured by using methods of manufacturing the chip packages, according to exemplary embodiments.
Figure 11:
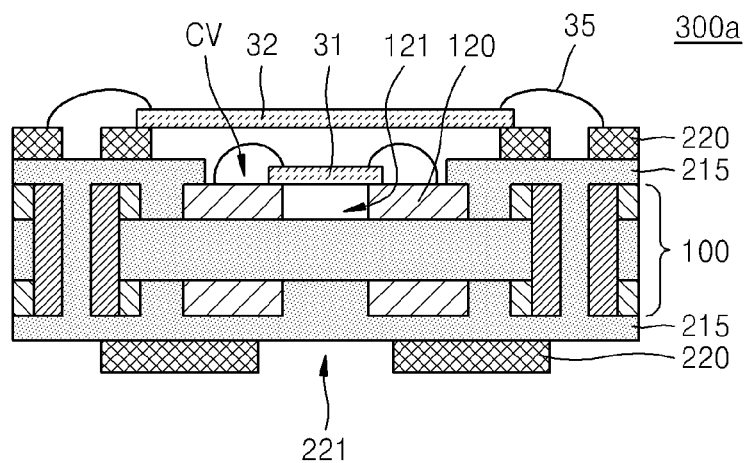

FIGS. 10 and 11 are cross-sectional views illustrating chip packages 300 and 300a manufactured by using methods of manufacturing the chip packages 300 and 300a, according to exemplary embodiments.

Each of the chip packages 300 and 300a of FIGS. 10 and 11 includes a semiconductor chip mounted on the circuit board 200 of FIG. 9.

Referring to FIGS. 10 and 11, a semiconductor chip is mounted on the circuit board 200 of FIG. 9. One semiconductor chip 30 may be mounted on the circuit board 200 as shown in FIG. 10. However, the present embodiment is not limited thereto, and a plurality of semiconductor chips 31 and 32 may be mounted on the circuit board 200, as shown in FIG. 11. Although two semiconductor chips, that is, the semiconductor chips 31 and 32, are mounted in FIG. 11, the present embodiment is not limited thereto, and three or more semiconductor chips may be mounted on the circuit board 200.

At least one semiconductor chip 30, 31, or 32 is mounted in the cavity CV. In FIG. 11, the semiconductor chip 31 may be mounted in the cavity CV, and the semiconductor chip 32 may be mounted outside the cavity CV. Each of the semiconductor chips 30, 31, and 32 may be electrically connected to an exposed portion of the metal layer 220 on which the external circuit pattern 221 is formed or to an exposed portion of the conductive layer 120 on which the internal circuit pattern 121 is formed, by using a bonding wire. Accordingly, the chip package 300 or 300a, which is the circuit board 200 on which the semiconductor chip 30, 31, or 32 is mounted, may be manufactured.

According to the present embodiment, since the cavity CV is formed in the circuit board 200, a thickness of the chip package 300 may be further reduced by mounting the semiconductor chip 30 in the cavity CV, as shown in FIG. 10. Since a thickness of the semiconductor chip 30 mounted in the cavity CV may be increased, and thus, it is possible to reduce a back grinding of the semiconductor chip 30, chip yield may be improved. Also, since the semiconductor chip 31 is mounted in the cavity CV, as shown in FIG. 11, more semiconductor chips may be mounted than when a chip package using a circuit board with no cavity is used.

Although now shown, an electrically connected member such as a bump may be further formed on the metal layer 220 disposed on a surface opposite to a surface of the circuit board 200 in which the cavity CV is formed. Also, the chip package 300 or 300a may be completed by sealing some or all of the semiconductor chips 30, 31, and 32, the bonding wires, and the circuit board 200 by using a mold resin, for example, an epoxy mold compound.

Although a multi-layer circuit board including the conductive layers 120 and metal layers 220 that are 4 in total is illustrated in the embodiments, the inventive concept is not limited thereto. A method of manufacturing any of various other multi-layer circuit boards (e.g., a 6-layer circuit board or an 8-layer circuit board) may be used.

Also, although a predetermined via-hole, a plated through-hole (PTH), and a predetermined circuit pattern are illustrated in the embodiments for convenience of explanation, the inventive concept is not limited thereto. It would be understood that different shapes, different numbers, or different patterns are within the scope of the inventive concept.

As described above, according to the embodiments, a process of manufacturing a circuit board may be simplified, manufacturing costs may be reduced, and cost competitiveness may be improved.

While the inventive concept has been particularly shown and described with reference to the above exemplary embodiments thereof, it will be understood by those of ordinary skill in the art that various changes in form and details may be made therein without departing from the spirit and scope of the inventive concept as defined by the following claims.

What is claimed is:

1. A method of manufacturing a circuit board, the method comprising:
    preparing a base substrate comprising a core layer and a first conductive layer that is formed on at least one surface of the core layer and comprises an internal circuit pattern;
    forming a build-up material to cover the first conductive layer;
    forming a metal layer on an outer surface of the build-up material facing the base substrate;
    removing a portion of the metal layer in which at least one cavity is to be formed;
    forming in the build-up material the at least one cavity through which the core layer and the first conductive layer are exposed;
    forming a laminated body by curing the build-up material in which the at least one cavity is formed; and
    forming a second conductive layer comprising an external circuit pattern on an outer surface of the laminated body by removing another portion of the metal layer,
    wherein the forming the at least one cavity comprises using wet etching to remove the build-up material exposed in a portion in which the at least one cavity is to be formed by using a solution.

2. The method of claim 1, wherein the build-up material comprises a matrix in which a structural body is impregnated, and the matrix comprises a thermosetting resin in a B-stage.

3. The method of claim 2, wherein the forming the laminated body comprises applying heat to perform cross-linking on the thermosetting resin in the B-stage and to obtain a thermosetting resin in a C-stage.

4. The method of claim 3, wherein a weight of the thermosetting resin in the B-stage is less than a weight of the thermosetting resin in the C-stage.

5. The method of claim 1, wherein a process temperature for forming the build-up material is lower than a process temperature for curing the build-up material.

6. The method of claim 1, wherein the solution comprises a glass etching agent.

7. The method of claim 1, wherein the core layer is formed of the same material as a material of the laminated body.

8. The method of claim 1, wherein the core layer is formed of the same material as a material forming the build-up material, and
    wherein, before the build-up material is cured to form the laminated body, the material in the buildup material is in a stage different from a stage where the material forming the core layer is in terms of temperature.

9. The method of claim 1 further comprising:
    mounting a semiconductor chip in the at least one cavity and electrically connecting the semiconductor chip and at least one of the first and second conductive layers.

10. The method of claim 9, wherein the build-up material comprises a matrix in which a structural body is impregnated, and the matrix comprises a thermosetting resin in a B-stage.

11. The method of claim 10, wherein the forming the laminated body comprises applying heat to perform cross-linking on the thermosetting resin in the B-stage and to obtain a thermosetting resin in a C-stage.

12. The method of claim 11, wherein a weight of the thermosetting resin in the B-stage is less than a weight of the thermosetting resin in the C-stage.

13. The method of claim 9, wherein the forming the at least one cavity comprises using wet etching to remove the build-up material exposed in a portion in which the at least one cavity is to be formed by using a solution.

14. A circuit board manufactured by using the method of claim 1.

15. A circuit board manufactured by using the method of claim 2.

16. A circuit board manufactured by using the method of claim 3.

17. A circuit board manufactured by using the method of claim 8.

* * * * *